US011631827B2

(12) United States Patent
Hu et al.

(10) Patent No.: US 11,631,827 B2
(45) Date of Patent: Apr. 18, 2023

(54) ELECTROLUMINESCENT DISPLAY PANEL COMPRISING PLURALITY OF PIXELS FORMING PLURALITY OF STANDING WAVES AND MANUFACTURING METHOD THEREOF

(71) Applicants: Hefei Xinsheng Optoelectronics Technology Co., Ltd., Hefei (CN); BOE Technology Group Co., Ltd., Beijing (CN)

(72) Inventors: Yue Hu, Beijing (CN); Xinxin Wang, Beijing (CN); Huai Ting Shih, Beijing (CN); Chin Lung Liao, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 814 days.

(21) Appl. No.: 16/339,146

(22) PCT Filed: Jun. 27, 2018

(86) PCT No.: PCT/CN2018/093091
§ 371 (c)(1),
(2) Date: Apr. 3, 2019

(87) PCT Pub. No.: WO2019/062229
PCT Pub. Date: Apr. 4, 2019

(65) Prior Publication Data
US 2021/0343966 A1 Nov. 4, 2021

(30) Foreign Application Priority Data

Sep. 27, 2017 (CN) .......................... 201710888893.1

(51) Int. Cl.
*H01L 27/32* (2006.01)
*H01L 51/50* (2006.01)
(Continued)

(52) U.S. Cl.
CPC ...... *H01L 51/5036* (2013.01); *H01L 51/0003* (2013.01); *H01L 51/5004* (2013.01);
(Continued)

(58) Field of Classification Search
None
See application file for complete search history.

(56) References Cited

U.S. PATENT DOCUMENTS 8,309,947 B2 11/2012 Vaufrey
9,450,028 B2 9/2016 Chou et al.
(Continued)

FOREIGN PATENT DOCUMENTS

CN 103123926 A 5/2013
CN 104638147 A 5/2015
(Continued)

OTHER PUBLICATIONS

Apr. 29, 2021—EP—Extended European Search Report Appn 18857378.6.
(Continued)

*Primary Examiner* — Daniel Whalen
(74) *Attorney, Agent, or Firm* — Banner & Witcoff, Ltd.

(57) ABSTRACT

An electroluminescent display panel and a manufacturing method thereof, and a display device. Each of a plurality of pixel units included in the electroluminescent display panel includes a first sub-pixel, a second sub-pixel and a third
(Continued)

|  | first sub-pixel | second sub-pixel | third sub-pixel |
|---|---|---|---|
| second electrode | 150 nm | 150 nm | 150 nm |
| electron injecting layer | 1 nm | 1 nm | 1 nm |
| electron transporting layer | 20 nm | 20 nm | 20 nm |
| light-emitting layer | 64 nm | 60 nm | 38 nm |
| hole transporting layer | 20 nm | 125 nm | 105 nm |
| hole injecting layer | 60 nm | 100 nm | 100 nm |
| first electrode | 50 nm | 50 nm | 50 nm | sub-pixel, respectively, each of the sub-pixels includes a first electrode, and a light-emitting layer, respectively, taking a planar surface of the first electrode facing the light-emitting layer as a reference plane, the light-emitting layer of the first sub-pixel is on a first anti-node of a first standing wave, the light-emitting layer of the second sub-pixel is on a second anti-node of a second standing wave, and the light-emitting layer of the third sub-pixel is on a second anti-node of a third standing wave.

11 Claims, 2 Drawing Sheets

(51) Int. Cl.
  *H01L 51/00* (2006.01)
  *H01L 51/56* (2006.01)
(52) U.S. Cl.
  CPC ...... *H01L 51/5056* (2013.01); *H01L 51/5072* (2013.01); *H01L 51/5088* (2013.01); *H01L 51/5092* (2013.01); *H01L 51/56* (2013.01); *H01L 2251/558* (2013.01)

(56) References Cited

U.S. PATENT DOCUMENTS

| | | | |
|---|---|---|---|
| 2009/0026921 A1* | 1/2009 | Kuma | ............... H01L 51/5265 |
| | | | 313/504 |
| 2012/0223346 A1 | 9/2012 | Ohsawa et al. | |
| 2014/0110682 A1 | 4/2014 | Shih | |
| 2015/0303393 A1 | 10/2015 | Dai et al. | |
| 2016/0126297 A1 | 5/2016 | Kim | |
| 2017/0250234 A1 | 8/2017 | He et al. | |
| 2017/0278914 A1 | 9/2017 | Cui et al. | |

FOREIGN PATENT DOCUMENTS

| | | |
|---|---|---|
| CN | 105576136 A | 5/2016 |
| CN | 106449714 A | 2/2017 |

OTHER PUBLICATIONS

Sep. 19, 2018—(WO) International Search Report and Written Opinion Appn PCT/CN2018/093091 English Translation.
Apr. 9, 2020 (CN) Office Action application 201710888893.1 with English Translation.

* cited by examiner

|  | red sub-pixel | green sub-pixel | blue sub-pixel |
|---|---|---|---|
| metal electrode | 150 nm | 150 nm | 150 nm |
| electron injecting layer | 1 nm | 1 nm | 1 nm |
| electron transporting layer | 20 nm | 20 nm | 20 nm |
| light-emitting layer | 64 nm | 60 nm | 38 nm |
| hole transporting layer | 175 nm | 125 nm | 105 nm |
| hole injecting layer | 100 nm | 100 nm | 100 nm |
| transparent electrode | 50 nm | 50 nm | 50 nm |

|  | first sub-pixel | second sub-pixel | third sub-pixel |
|---|---|---|---|
| second electrode | 150 nm | 150 nm | 150 nm |
| electron injecting layer | 1 nm | 1 nm | 1 nm |
| electron transporting layer | 20 nm | 20 nm | 20 nm |
| light-emitting layer | 64 nm | 60 nm | 38 nm |
| hole transporting layer | 20 nm | 125 nm | 105 nm |
| hole injecting layer | 60 nm | 100 nm | 100 nm |
| first electrode | 50 nm | 50 nm | 50 nm |

FIG. 2C

ELECTROLUMINESCENT DISPLAY PANEL COMPRISING PLURALITY OF PIXELS FORMING PLURALITY OF STANDING WAVES AND MANUFACTURING METHOD THEREOF

The application is a U.S. National Phase Entry of International Application No. PCT/CN2018/093091 filed on Jun. 27, 2018, designating the United States of America and claiming priority to Chinese Patent Application No. 201710888893.1, filed on Sep. 27, 2017. The present application claims priority to and the benefit of the above-identified applications and the above-identified applications are incorporated by reference herein in their entirety.

TECHNICAL FIELD

At least an embodiment of the present disclosure relates to an electroluminescent display panel and a manufacturing method thereof, and a display device.

BACKGROUND

Generally, different sub-pixels can be manufactured by a solution process method, so as to achieve the characteristics of a high material utilization ratio and a low manufacturing cost of an organic light-emitting diode (OLED). The solution process method has become a research hotspot because of having a good adjustability of compositions and a low production cost.

SUMMARY

At least an embodiment of the present disclosure provides an electroluminescent display panel and a manufacturing method thereof, and a display device. A printing process window of a first sub-pixel in the electroluminescent display panel can be greatly increased, thereby improving a performance of a display device.

At least an embodiment of the present disclosure provides an electroluminescent display panel, which comprises: a plurality of pixel units, each of the plurality of pixel units comprising a first sub-pixel, a second sub-pixel and a third sub-pixel, each of the sub-pixels comprising a first electrode, a light-emitting layer and a second electrode stacked in sequence, wherein the first sub-pixel emits a first color light, the first color light forms a first standing wave in the first sub-pixel, the second sub-pixel emits a second color light, the second color light forms a second standing wave in the second sub-pixel, the third sub-pixel emits a third color light, the third color light forms a third standing wave in the third sub-pixel, a wavelength of the first color light is greater than a wavelength of the second color light and a wavelength of the third color light, taking a planar surface of the first electrode facing the light-emitting layer as a reference plane, the light-emitting layer of the first sub-pixel is on a first anti-node of the first standing wave, the light-emitting layer of the second sub-pixel is on a second anti-node of the second standing wave, and the light-emitting layer of the third sub-pixel is on a second anti-node of the third standing wave.

For example, a distance between the first electrode and the second electrode in the first sub-pixel is N1 times of a period of the first standing wave, a distance between the first electrode and the second electrode in the second sub-pixel is N2 times of a period of the second standing wave, a distance between the first electrode and the second electrode in the third sub-pixel is N3 times of a period of the third standing wave, N1<N2 and N1<N3, where N1, N2 and N3 are positive integers.

For example, the first electrode is on a light exiting side of the light-emitting layer.

For example, the first electrode is a transparent electrode layer or a transflective electrode layer, and the second electrode is a reflective electrode layer.

For example, each of the sub-pixels further comprises a hole injecting layer and a hole transporting layer stacked in sequence between the first electrode and the light-emitting layer.

For example, the first sub-pixel is a red sub-pixel, the hole injecting layer in the red sub-pixel has a thickness of 30-70 nm, and the hole transporting layer in the red sub-pixel has a thickness of 15-30 nm.

For example, the second sub-pixel is a green sub-pixel, and the third sub-pixel is a blue sub-pixel.

For example, the hole injecting layer in the green sub-pixel has a thickness of 15-110 nm, and the hole transporting layer in the green sub-pixel has a thickness of 35-135 nm.

For example, the hole injecting layer in the blue sub-pixel has a thickness of 15-110 nm, and the hole transporting layer in the blue sub-pixel has a thickness of 15-115 nm.

For example, each of the sub-pixels further comprises an electron injecting layer and an electron transporting layer stacked in sequence between the second electrode and the light-emitting layer.

For example, the electron injecting layer in each of the sub-pixels has an equal thickness, and the electron transporting layer in each of the sub-pixels has an equal thickness.

For example, the electroluminescent display panel is an organic light-emitting diode display panel.

At least an embodiment of the present disclosure provides a manufacturing method of an electroluminescent display panel, which comprises: forming a plurality of pixel units on a base substrate, forming each of the plurality of pixel units comprising forming a first sub-pixel, a second sub-pixel and a third sub-pixel, forming each of the sub-pixels comprising forming a first electrode, a light-emitting layer and a second electrode in a direction perpendicular to the base substrate, wherein the first sub-pixel emits a first color light, the first color light forms a first standing wave in the first sub-pixel, the second sub-pixel emits a second color light, the second color light forms a second standing wave in the second sub-pixel, the third sub-pixel emits a third color light, the third color light forms a third standing wave in the third sub-pixel, a wavelength of the first color light is greater than a wavelength of the second color light and a wavelength of the third color light, taking a planar surface of the first electrode facing the light-emitting layer as a reference plane, the light-emitting layer of the first sub-pixel is on a first anti-node of the first standing wave, the light-emitting layer of the second sub-pixel is on a second anti-node of the second standing wave, and the light-emitting layer of the third sub-pixel is on a second anti-node of the third standing wave.

For example, forming each of the sub-pixels comprises: forming the light-emitting layer by a solution process.

For example, forming each of the sub-pixels further comprises: forming at least one selected from the group consisting of a hole transporting layer and a hole injecting layer between the first electrode and the light-emitting layer by a solution process.

At least an embodiment of the present disclosure provides a display device, which comprises: the electroluminescent display panel provided by any one embodiment of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship.

Figure 1:
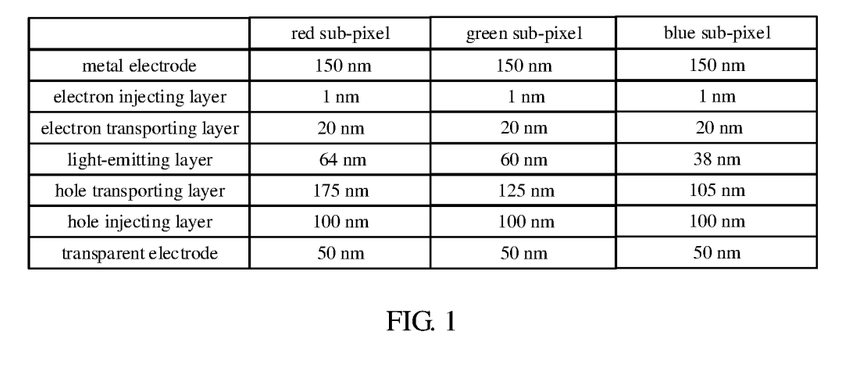
FIG. 1 is a schematic diagram showing a thickness of some film layers of each sub-pixel in a pixel unit of an organic light-emitting diode display.

FIG. 1 is a schematic diagram showing a thickness of some film layers of each sub-pixel in a pixel unit of an organic light-emitting diode display, and an arrangement order of the film layers in each sub-pixel is also the same as the arrangement order of the film layers in the table shown in FIG. 1, that is, in sequence, a metal electrode, an electron injecting layer, an electron transporting layer, a light-emitting layer, a hole transporting layer, a hole injecting layer and a transparent electrode (ITO). As shown in FIG. 1, a distance between the metal electrode and the transparent electrode in a red (R) sub-pixel of the pixel unit is 360 nm, a distance between the metal electrode and the transparent electrode in a green (G) sub-pixel of the pixel unit is 306 nm, and a distance between the metal electrode and the transparent electrode in a blue (B) sub-pixel of the pixel unit is 264 nm.

Taking the red sub-pixel as an example, red light emitted by the light-emitting layer in the red sub-pixel can form a red standing wave between the metal electrode and the transparent electrode (which has a transflective effect), and a period of an anti-node of the red standing wave is ($\lambda/2*n$), where $\lambda$ is the wavelength of the red light, n is the effective refractive index of media between the metal electrode and the transparent electrode, $n=(n1*d1+n2*d2+ \ldots )/(d1+d2+ \ldots )$, n is generally taken as 1.8.

As shown in FIG. 1, in the red sub-pixel, the electron injecting layer has a thickness of 1 nm, the electron transporting layer has a thickness of 20 nm, the light-emitting layer has a thickness of 64 nm, the hole transporting layer has a thickness of 175 nm, and the hole injecting layer has a thickness of 100 nm, therefore, a distance between the metal electrode and the transparent electrode is $D_0=360$ nm. The wavelength of the red light emitted from the organic light-emitting diode display in FIG. 1 is chosen as 610 nm, and the period of the antinode of the standing wave is about 170 nm. Therefore, $D_0$ is about two times of the period of the standing wave antinode of the red standing wave. In the meanwhile, taking a surface of the transparent electrode facing the light-emitting layer as a reference plane, it can be seen from the thicknesses of the film layers in the red sub-pixel that, the light-emitting layer in the red sub-pixel is located on a second standing wave anti-node of the red standing wave. At this time, the red light emitted by the light-emitting layer comes into a constructive interference to enhance a light intensity of the red light.

Because the light emitted by the light-emitting layer can be absorbed by an organic film layer, it is not that the thicker or the thinner the thickness of the device is, the better. That is, it is not that the larger or the smaller the distance between the metal electrode and the transparent electrode in the sub-pixel is, the better. Here, the distance between the metal electrode and the transparent electrode is two times of the period of the standing wave anti-node of the red standing wave. At this time, the thickness of the red sub-pixel is appropriate, which can ensure that a light exiting efficiency of the red light is high.

Similarly, in FIG. 1, a distance between the metal electrode and the transparent electrode in the green sub-pixel is about two times of a period of the standing wave anti-node of the green standing wave, and a distance between the metal electrode and the transparent electrode in the blue sub-pixel is about two times of the period of the standing wave anti-node of the blue standing wave. At this time, the thicknesses of the green sub-pixel and the blue sub-pixel are appropriate, which can ensure that light exiting efficiencies of the green light and the blue light are high. Taking a surface of the transparent electrode facing the light-emitting layer as a reference plane, the light-emitting layer in the green sub-pixel is located on a second standing wave anti-node of the green standing wave, and the light-emitting layer in the blue sub-pixel is located on a second standing wave anti-node of the blue standing wave. Therefore, the green light emitted by the light-emitting layer in the green sub-pixel comes into a constructive interference to enhance a light intensity of the green light, and the blue light emitted by the light-emitting layer in the blue sub-pixel comes into a constructive interference to enhance a light intensity of the blue light.

In research, inventors of the present application find: upon the organic light-emitting diode device being prepared by a solution process, in the process of printing a sub-pixel by using a solution, the volume of the solution that can be contained in the sub-pixel is restricted, that is, the solution is restricted by factors such as the solubility in the solvent, the height of the retaining wall, and the hydrophobic property. Therefore, the thickness of each functional layer cannot be adjusted as freely as in a vapor deposition of a sub-pixel, which results in a great limitation of a printing process window of the sub-pixel. Upon the light-emitting layer of each sub-pixel in the pixel unit of the organic light-emitting diode device being disposed on the optimal second standing wave anti-node of the respective standing wave, the printing process window of the red sub-pixel is greatly restricted, that is, the volume of the solution contained in the red sub-pixel is greatly restricted. However, if the light-emitting layer of each sub-pixel is disposed on the first standing wave antinode of the respective standing wave, a power leakage of the device may be caused due to the small thickness of the whole layers in the device, thereby affecting a yield of the display device.

Embodiments of the present disclosure provide an electroluminescent display panel and a manufacturing method thereof, and a display device. The electroluminescent display panel comprises: a plurality of pixel units, each of the plurality of pixel units comprising a first sub-pixel, a second sub-pixel and a third sub-pixel, each of the sub-pixels comprising a first electrode, a light-emitting layer and a second electrode stacked in sequence, wherein the first sub-pixel emits a first color light, the first color light forms a first standing wave in the first sub-pixel, the second sub-pixel emits a second color light, the second color light forms a second standing wave in the second sub-pixel, the third sub-pixel emits a third color light, the third color light forms a third standing wave in the third sub-pixel, a wavelength of the first color light is greater than a wavelength of the second color light and a wavelength of the third color light, taking a planar surface of the first electrode facing the light-emitting layer as a reference plane, the light-emitting layer of the first sub-pixel is on a first anti-node of the first standing wave, the light-emitting layer of the second sub-pixel is on a second anti-node of the second standing wave, and the light-emitting layer of the third sub-pixel is on a second anti-node of the third standing wave. A printing process window of the first sub-pixel in the electroluminescent display panel can be greatly increased, thereby improving a performance of the display device.

Hereinafter, an electroluminescent display panel, and a manufacturing method thereof, and a display device, provided by embodiments of the present disclosure, will be described with reference to the accompanying drawings.

Figure 2A:
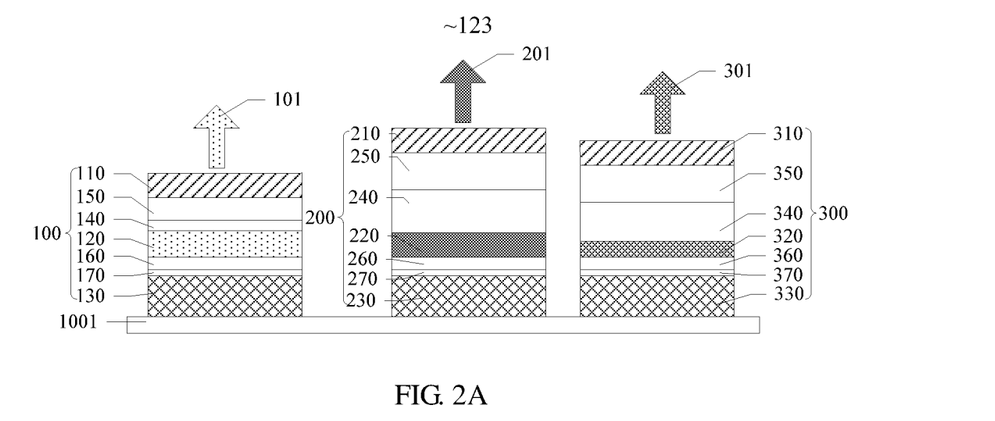
FIG. 2A is a partial structural view of a pixel unit comprised in an electroluminescent display panel provided by an embodiment of the present disclosure.
Figure 2B:
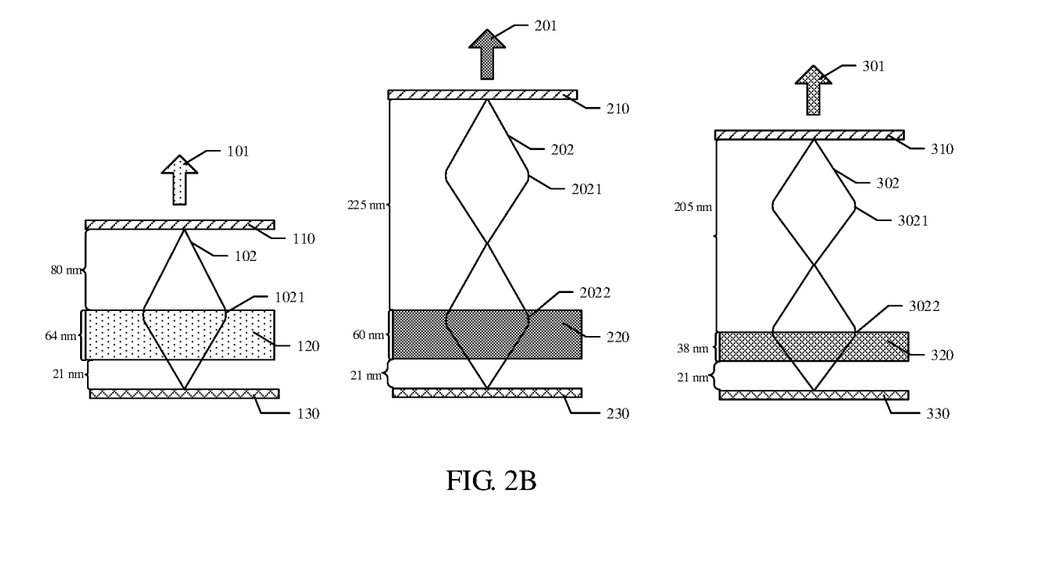
FIG. 2B is a schematic diagram of standing waves in each sub-pixel shown in FIG. 2A.
Figure 2C:
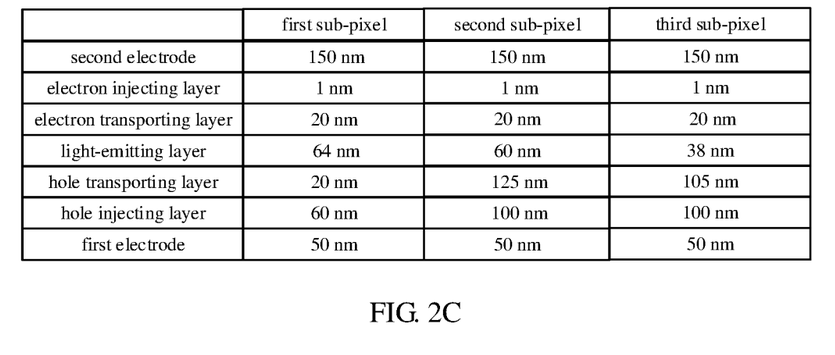
FIG. 2C is a schematic diagram showing a thickness of film layers in each sub-pixel shown in FIG. 2B.

An embodiment of the present disclosure provides an electroluminescent display panel. FIG. 2A is a partial structural view of a pixel unit comprised in an electroluminescent display panel provided by an embodiment of the present disclosure, FIG. 2B is a schematic diagram of standing waves in each sub-pixel shown in FIG. 2A, and FIG. 2C is a schematic diagram showing a thickness of film layers in each sub-pixel shown in FIG. 2B. As shown in FIG. 2A and FIG. 2B, the electroluminescent display panel comprises a plurality of pixel units 123, for example, a plurality of pixel units arranged in an array (only one pixel unit 123 is shown in FIG. 2A), each of the plurality of pixel units 123 comprising a first sub-pixel 100, a second sub-pixel 200 and a third sub-pixel 300, each of the sub-pixels 100, 200, 300, comprising a first electrode 110, 210, 310, a light-emitting layer 120, 220, 320, and a second electrode 130, 230, 330, stacked in sequence. The first sub-pixel 100 emits a first color light 101, the first color light 101 forms a first standing wave 102 in the first sub-pixel 100, the second sub-pixel 200 emits a second color light 201, the second color light 201 forms a second standing wave 202 in the second sub-pixel 200, the third sub-pixel 300 emits a third color light 301, the third color light 301 forms a third standing wave 302 in the third sub-pixel 300, a wavelength of the first color light 101 is greater than a wavelength of the second color light 201 and a wavelength of the third color light 301, taking a planar surface of the first electrode 110, 210, 310, facing the light-emitting layer 120, 220, 320, as a reference plane (the first electrode is on a light exiting side of the light-emitting layer), the light-emitting layer 120 of the first sub-pixel 100 is on a first anti-node 1021 of the first standing wave 102, the light-emitting layer 220 of the second sub-pixel 200 is on a second anti-node 2022 of the second standing wave 202, and the light-emitting layer 320 of the third sub-pixel 300 is on a second anti-node 3022 of the third standing wave 320. On one hand, the light-emitting layer of each sub-pixel is located on an anti-node of the respective standing wave, at this time, the color light emitted by each light-emitting layer comes into a constructive interference to enhance a light intensity of the color light; on the other hand, the light-emitting layer of the first sub-pixel is located on the first anti-node of the first standing wave, therefore, the ink process window required by the first sub-pixel can be greatly increased upon the electroluminescent display panel being prepared by a solution process, thereby improving the performance of the display device.

Because the light-emitting layer has a certain thickness, "the light-emitting layer of each sub-pixel is located on an anti-node of the respective standing wave" in the present embodiment, comprises a case in which an anti-node of the standing wave in each sub-pixel is located inside the respective light-emitting layer or located outside but very close to the respective light-emitting layer.

For example, as shown in FIG. 2A, the electroluminescent display panel further comprises a base substrate 1001, the plurality of pixel units 123 being disposed on the base substrate 1001, and the sub-pixels in the plurality of pixel units 123 are sequentially disposed in a plane parallel to the base substrate 1001. For example, the base substrate is provided with the sub-pixels arranged in an array.

For example, as shown in FIG. 2A, each of the sub-pixels 100, 200, 300, further comprises a hole injecting layer 150, 250, 350 and a hole transporting layer 140, 240, 340, stacked in sequence between the first electrode 110, 210, 310, and the light-emitting layer 120, 220, 320.

For example, as shown in FIG. 2A, each of the sub-pixels 100, 200, 300, further comprises an electron injecting layer 170, 270, 370, and an electron transporting layer 160, 260, 360, stacked in sequence between the second electrode 130, 230, 330, and the light-emitting layer 120, 220, 320.

For example, as shown in FIG. 2A-2C, a thickness of the electron injecting layer 170, 270, 370, in each of the sub-pixels 100, 200, 300, is equal, and a thickness of the electron transporting layer 160, 260, 360, in each of the sub-pixels is equal. Therefore, the electron injecting layers and the electron transporting layers in each of the plurality of pixel units can be formed as an entire-surface film layer, respectively.

For example, as shown in FIG. 2A, the first sub-pixel 100 is a red sub-pixel, the hole injecting layer 150 in the red sub-pixel has a thickness of 30-70 nm, and the hole transporting layer 140 in the red sub-pixel has a thickness of 15-30 nm.

For example, as shown in FIG. 2A-2C, in the first sub-pixel 100, the hole injecting layer 150 has a thickness of 60 nm, the hole transporting layer 140 has a thickness of 20 nm, the light-emitting layer 120 has a thickness of 64 nm, the electron transporting layer 160 has a thickness of 20 nm and the electron injecting layer 170 has a thickness of 1 nm, therefore, a distance between the first electrode 110 and the second electrode 130 in the first sub-pixel 100 is 165 nm.

For example, as shown in FIG. 2A, the second sub-pixel 200 is a green sub-pixel, and the third sub-pixel 300 is a blue sub-pixel.

For example, as shown in FIG. 2A and FIG. 2B, the hole injecting layer 250 in the green sub-pixel has a thickness of 15-110 nm, and the hole transporting layer 240 in the green sub-pixel has a thickness of 35-135 nm.

For example, as shown in FIG. 2A-2C, in the second sub-pixel 200, the hole injecting layer 250 has a thickness of 100 nm, the hole transporting layer 240 has a thickness of 125 nm, the light-emitting layer 220 has a thickness of 60 nm, the electron transporting layer 260 has a thickness of 20 nm and the electron injecting layer 270 has a thickness of 1 nm, therefore, a distance between the first electrode 210 and the second electrode 230 in the second sub-pixel 200 is 306 nm.

For example, as shown in FIG. 2A and FIG. 2B, the hole injecting layer 350 in the blue sub-pixel has a thickness of 15-110 nm, and the hole transporting layer 340 in the blue sub-pixel has a thickness of 15-115 nm.

For example, as shown in FIG. 2A-2C, in the third sub-pixel 300, the hole injecting layer 350 has a thickness of 100 nm, the hole transporting layer 340 has a thickness of 105 nm, the light-emitting layer 320 has a thickness of 38 nm, the electron transporting layer 360 has a thickness of 20 nm and the electron injecting layer 370 has a thickness of 1 nm, therefore, a distance between the first electrode 310 and the second electrode 330 in the third sub-pixel 300 is 264 nm.

For example, as shown in FIG. 2A and FIG. 2B, the first electrodes 110, 210, 310, are a transparent electrode layer or a transflective electrode layer, and the second electrodes 130, 230, 330, are a reflective electrode layer, therefore, one color light emitted by each light-emitting layer forms a standing wave between the first electrode and the second electrode, and a period of the standing wave being formed is ($\lambda/2*n$), where $\lambda$ is the wavelength of the color light emitted by the light-emitting layer, n is the effective refractive index of media between the metal electrode and the transparent electrode, $n=(n1*d1+n2*d2+ \ldots )/(d1+d2+ \ldots )$, n is generally taken as 1.8.

For example, the first electrode can comprise a semi-transparent metal layer, for example, a semi-transparent film layer formed of aluminum, copper, molybdenum, titanium, platinum, nickel, chromium, silver, gold, tungsten, or the like or an alloy thereof. For example, the first electrode can also comprises a translucent composite electrode formed of a metal layer and a transparent electrode layer (for example, indium tin oxide, indium zinc oxide, aluminum zirconium oxide, zirconium oxide, etc.).

For example, the first electrode can comprise a transparent material, such as indium tin oxide, indium zinc oxide, aluminum zirconium oxide, zirconium oxide, etc.

For example, the second electrode can comprise a metal material, such as an opaque metal layer formed of aluminum, copper, molybdenum, titanium, platinum, nickel, chromium, silver, gold, tungsten, or an alloy thereof.

For example, a thickness of the first electrode in each of the sub-pixels is equal, and a thickness of the second electrode in each of the sub-pixels is equal. For example, the first electrode in each of the sub-pixels has a thickness of 50-135 nm.

For example, a distance between the first electrode 110 and the second electrode 130 in the first sub-pixel 100 is N1 times of a period of the first standing wave, a distance between the first electrode 210 and the second electrode 230 in the second sub-pixel 200 is N2 times of a period of the second standing wave, a distance between the first electrode 310 and the second electrode 330 in the third sub-pixel 300 is N3 times of a period of the third standing wave, N1<N2 and N1<N3, where N1, N2 and N3 are positive integers. That is, the distance between the first electrode and the second electrode in each of the sub-pixels is an integral times of the period of the standing wave formed in the each of the sub-pixels, and the period of the standing wave here refers to the period of the standing wave anti-node. In addition, N1, N2 and N3 are each approximately a positive integer, that is, the values of N1, N2 and N3 satisfy a certain error range, for example, the difference between N1, N2, and N3 and the positive integer closest thereto is no more than 0.15.

For example, as shown in FIG. 2A-2C, the wavelength of the red light emitted by the light-emitting layer of the red sub-pixel in the present embodiment is chosen as 610 nm, so that the period of the anti-node of the first standing wave in the red sub-pixel is about 610 nm/(2*1.8)≈170 nm. The distance between the first electrode 110 and the second electrode 130 in the first sub-pixel 100 shown in FIG. 2B and FIG. 2C is 165 nm, therefore, the distance between the first electrode 110 and the second electrode 130 in the first sub-pixel 100 is approximately one time of the period of the first standing wave. In addition, according to the thickness of each film layer and the period of the anti-node of the first standing wave, taking a surface of the first electrode 110 in the first sub-pixel 100 facing the light-emitting layer 120 as a reference plan, the light-emitting layer 120 in the first sub-pixel 100 is located on the first anti-node 1021 of the first standing wave 102 (the first standing wave 102 in the first sub-pixel 100 includes one anti-node only), therefore, the color light emitted by the light-emitting layer in the first sub-pixel comes into a constructive interference to enhance a light intensity of the color light.

For example, as shown in FIG. 2A-2C, the wavelength of the green light emitted by the light-emitting layer of the green sub-pixel in the present embodiment is chosen as 540 nm, so that the period of the anti-node of the second standing wave in the green sub-pixel is about 540 nm/(2*1.8)≈150 nm. The distance between the first electrode 210 and the second electrode 230 in the second sub-pixel 200 shown in FIG. 2B and FIG. 2C is 306 nm, therefore, the distance between the first electrode 210 and the second electrode 230 in the second sub-pixel 200 is approximately two times of the period of the second standing wave. In addition, according to the thickness of each film layer and the period of the anti-node of the second standing wave, taking a surface of the first electrode 210 in the second sub-pixel 200 facing the light-emitting layer 220 as a reference plan, the light-emitting layer 220 in the second sub-pixel 200 is located on the second anti-node 2022 of the second standing wave 202 (the second standing wave 202 in the second sub-pixel 200 includes two anti-nodes, and the first anti-node 2021 of the second standing wave 202 is located inside the hole injecting layer 250), therefore, the color light emitted by the light-emitting layer in the second sub-pixel comes into a constructive interference to enhance a light intensity of the color light.

For example, as shown in FIG. 2A-2C, the wavelength of the blue light emitted by the light-emitting layer of the blue sub-pixel in the present embodiment is chosen as 470 nm, so that the period of the anti-node of the third standing wave in the blue sub-pixel is about 470 nm/(2*1.8)≈130 nm. The distance between the first electrode 310 and the second electrode 330 in the third sub-pixel 300 shown in FIG. 2B and FIG. 2C is 264 nm, therefore, the distance between the first electrode 310 and the second electrode 330 in the third sub-pixel 300 is approximately two times of the period of the third standing wave. In addition, according to the thickness of each film layer and the period of the anti-node of the third standing wave, taking a surface of the first electrode 310 in the third sub-pixel 300 facing the light-emitting layer 320 as a reference plan, the light-emitting layer 320 in the third sub-pixel 300 is located on the second anti-node 3022 of the third standing wave 302 (the third standing wave 302 in the third sub-pixel 300 includes two anti-nodes, and the first anti-node 3021 of the third standing wave 302 is located inside the hole injecting layer 350), therefore, the color light emitted by the light-emitting layer in the third sub-pixel comes into a constructive interference to enhance a light intensity of the color light.

It should be noted that, the thickness of each film layer in each sub-pixel and the value of the wavelength of light emitted by each sub-pixel in the above examples are only exemplary. In practical process, the thickness of each film layer and the wavelength of light emitted by each sub-pixel can be set according to actual demands, which is not limited in the present embodiment.

Compared with the electroluminescent display panel shown in FIG. 1, the thicknesses of the hole transporting layer and the hole injecting layer in the first sub-pixel in the present embodiment is thinned. Therefore, in the present embodiment, by adjusting the first sub-pixel in the electroluminescent display panel, namely the thicknesses of the hole transporting layer and the hole injecting layer in the red sub-pixel, the light-emitting layer of the first sub-pixel is located on the first anti-node of the first standing wave, and the distance between the first electrode and the second electrode is about one time of the period of the first standing wave, so that the printing process window of the first sub-pixel is greatly increased to improve the performance of the display panel.

For example, the electroluminescent display panel provided by the present embodiment is an organic light-emitting diode display panel. For example, the electroluminescent display panel can be a regular electroluminescent display panel or an inverted electroluminescent display panel.

An embodiment of the present disclosure provides a manufacturing method of an electroluminescent display panel, which comprises: forming a plurality of pixel units on a base substrate, forming each of the plurality of pixel units comprising forming a first sub-pixel, a second sub-pixel and a third sub-pixel, forming each of the sub-pixels comprising forming a first electrode, a light-emitting layer and a second electrode in sequence along a direction perpendicular to the base substrate.

For example, the second electrode can be formed on the base substrate, the light-emitting layer can be formed on a side of the second electrode away from the base substrate, the first electrode can be formed on a side of the light-emitting layer away from the base substrate, and the first electrode is on a light exiting side of the light-emitting layer.

For example, the first electrode comprised in each of the sub-pixels is a transparent electrode layer or a transflective electrode layer, and the second electrode comprised in each of the sub-pixels is a reflective electrode layer. Therefore, one color light emitted by each light-emitting layer forms a standing wave between the first electrode and the second electrode, that is, the light emitted by the light-emitting layer propagates to the first electrode and the second electrode, respectively, and is respectively reflected by the first electrode (reflecting part of the light and transmitting part of the light) and the second electrode, and the light respectively reflected by the two electrodes forms a standing wave between the first electrode and the second electrode, and a period of the standing wave being formed is ($\lambda/2*n$), where $\lambda$ is the wavelength of the color light emitted by the light-emitting layer, n is the effective refractive index of media between the metal electrode and the transparent electrode, $n=(n1*d1+n2*d2+ \ldots )/(d1+d2+ \ldots )$, n is generally taken as 1.8.

For example, in the manufacturing method of the electroluminescent display panel provided by the present embodiment, the light-emitting layer is formed by a solution process. For example, the light-emitting layer is formed by inkjet printing.

For example, before forming the light-emitting layer, the manufacturing method of the electroluminescent display panel provided by the present embodiment further comprises: forming an electron injecting layer and an electron transporting layer stacked in sequence on a side of the second electrode away from the base substrate. The electron injecting layer and the electron transporting layer in the present embodiment can each be an entire-surface film layer, that is, a thickness of the electron injecting layer in each of the sub-pixels is equal, and a thickness of the electron transporting layer in each of the sub-pixels is equal.

For example, before forming the first electrode, the manufacturing method of the electroluminescent display panel provided by the present embodiment further comprises: forming a hole transporting layer and a hole injecting layer stacked in sequence on a side of the light-emitting layer away from the base substrate.

For example, at least one selected from the group consisting of the hole transporting layer and the hole injecting layer between the first electrode and the light-emitting layer can be formed by a solution process.

For example, the light-emitting layer, the hole transporting layer and the hole injecting layer in each of the sub-pixels can be formed in sequence by a solution process.

In the electroluminescent display panel manufactured by the manufacturing method of the electroluminescent display panel provided by the present embodiment, the first sub-pixel emits a first color light, the first color light forms a first standing wave in the first sub-pixel, the second sub-pixel emits a second color light, the second color light forms a second standing wave in the second sub-pixel, the third sub-pixel emits a third color light, the third color light forms a third standing wave in the third sub-pixel, a wavelength of the first color light is greater than a wavelength of the second color light and a wavelength of the third color light, taking a planar surface of the first electrode facing the light-emitting layer as a reference plane, the light-emitting layer of the first sub-pixel is on a first anti-node of the first standing wave, the light-emitting layer of the second sub-pixel is on a second anti-node of the second standing wave, and the light-emitting layer of the third sub-pixel is on a second anti-node of the third standing wave. On one hand, the light-emitting layer of each sub-pixel is located on an anti-node of the respective standing wave, at this time, the color light emitted by each light-emitting layer comes into a constructive interference to enhance a light intensity of the color light; on the other hand, the light-emitting layer of the first sub-pixel is located on the first anti-node of the first standing wave, therefore, the ink process window required by the first sub-pixel can be greatly increased upon the electroluminescent display panel being prepared by a solution process, thereby improving the performance of the display device.

For example, the first sub-pixel is a red sub-pixel, the hole injecting layer in the red sub-pixel has a thickness of 30-70 nm, and the hole transporting layer in the red sub-pixel has a thickness of 15-30 nm.

For example, the second sub-pixel is a green sub-pixel, and the third sub-pixel is a blue sub-pixel.

For example, the hole injecting layer in the green sub-pixel has a thickness of 15-110 nm, and the hole transporting layer in the green sub-pixel has a thickness of 35-135 nm.

For example, the hole injecting layer in the blue sub-pixel has a thickness of 15-110 nm, and the hole transporting layer in the blue sub-pixel has a thickness of 15-115 nm.

For example, a distance between the first electrode and the second electrode in the first sub-pixel is N1 times of a period of the first standing wave, a distance between the first electrode and the second electrode in the second sub-pixel is N2 times of a period of the second standing wave, a distance between the first electrode and the second electrode in the third sub-pixel is N3 times of a period of the third standing wave, N1<N2 and N1<N3, where N1, N2 and N3 are positive integers. That is, the distance between the first electrode and the second electrode in each of the sub-pixels is an integral times of the period of the standing wave formed in the each of the sub-pixels, and the period of the standing wave here refers to the period of the standing wave anti-node.

For example, the distance between the first electrode and the second electrode in the first sub-pixel is approximately one time of the period of the first standing wave, the distance between the first electrode and the second electrode in the second sub-pixel is approximately two times of the period of the second standing wave, the distance between the first electrode and the second electrode in the third sub-pixel is approximately two times of the period of the third standing wave.

In the manufacturing method of the electroluminescent display panel provided by the present embodiment, by adjusting the thicknesses of the hole transporting layer and the hole injecting layer in the first sub-pixel (red sub-pixel) of the electroluminescent display panel in the manufacturing process, the light-emitting layer of the first sub-pixel can be located on the first anti-node of the first standing wave, and the distance between the first electrode and the second electrode is about one time of the period of the first standing wave, so that the printing process window of the first sub-pixel is greatly increased to improve the performance of the display panel.

Another embodiment of the present disclosure provides a display device, which comprises the electroluminescent display panel provided by any one of the aforementioned embodiments. The printing process window of the first sub-pixel in the display device can be greatly increased to improve the performance of the display device.

For example, the display device can be a display such as an organic light-emitting diode (OLED) display, and any product or component comprising the display and having a display function such as a television, a digital camera, a mobile phone, a watch, a tablet computer, a notebook computer, a navigator, etc., which is not limited thereto in the present embodiment The following statements should be noted:

(1) Unless otherwise defined, the same reference numeral represents the same meaning in the embodiments of the disclosure and accompanying drawings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. An electroluminescent display panel, comprising:
 a plurality of pixel units, each of the plurality of pixel units comprising a first sub-pixel, a second sub-pixel, and a third sub-pixel, each of the sub-pixels comprising a first electrode, a light-emitting layer, and a second electrode stacked in sequence,
 wherein the first sub-pixel emits a first color light, the first color light forms a first standing wave including a first anti-node in the first sub-pixel, the second sub-pixel emits a second color light, the second color light forms a second standing wave including a first anti-node and a second anti-node in the second sub-pixel, the third sub-pixel emits a third color light, the third color light forms a third standing wave including a first anti-node and a second anti-node in the third sub-pixel, a wavelength of the first color light is greater than a wavelength of the second color light and a wavelength of the third color light, taking a planar surface of the first electrode facing the light-emitting layer as a reference plane, the light-emitting layer of the first sub-pixel is on the first anti-node of the first standing wave, the light-emitting layer of the second sub-pixel is on the second anti-node of the second standing wave, and the light-emitting layer of the third sub-pixel is on the second anti-node of the third standing wave, and
 wherein the light-emitting layer is formed by a solution process,
 each of the sub-pixels further comprises a hole injecting layer and a hole transporting layer stacked in sequence between the first electrode and the light-emitting layer, the first anti-node of the second standing wave is located inside the hole injecting layer of the second sub-pixel, and the first anti-node of the third standing wave is located inside the hole injecting layer of the third sub-pixel,
 the first sub-pixel is a red sub-pixel, the hole injecting layer in the red sub-pixel has a thickness of 30-70 nm, and the hole transporting layer in the red sub-pixel has a thickness of 15-30 nm,
 the second sub-pixel is a green sub-pixel, the hole injecting layer in the green sub-pixel has a thickness of 15-110 nm, and the hole transporting layer in the green sub-pixel has a thickness of 35-135 nm,
 the third sub-pixel is a blue sub-pixel, the hole injecting layer in the blue sub-pixel has a thickness of 15-110 nm, and the hole transporting layer in the blue sub-pixel has a thickness of 15-115 nm, and each of the sub-pixels further comprises an electron injecting layer and an electron transporting layer stacked in sequence between the second electrode and the light-emitting layer, the electron injecting layer in each of the sub-pixels has an equal thickness, and the electron transporting layer in each of the sub-pixels has an equal thickness.

2. The electroluminescent display panel according to claim 1, wherein a distance between the first electrode and the second electrode in the first sub-pixel is N1 times of a period of the first standing wave, a distance between the first electrode and the second electrode in the second sub-pixel is N2 times of a period of the second standing wave, a distance between the first electrode and the second electrode in the third sub-pixel is N3 times of a period of the third standing wave, N1<N2 and N1<N3, where N1, N2, and N3 are positive integers.

3. The electroluminescent display panel according to claim 1, wherein the first electrode is on a light exiting side of the light-emitting layer.

4. The electroluminescent display panel according to claim 3, wherein the first electrode is a transparent electrode layer or a transflective electrode layer, and the second electrode is a reflective electrode layer.

5. The electroluminescent display panel according to claim 1, wherein the electroluminescent display panel is an organic light-emitting diode display panel.

6. A display device, comprising: the electroluminescent display panel according to claim 1.

7. The display device according to claim 6, wherein a distance between the first electrode and the second electrode in the first sub-pixel is N1 times of a period of the first standing wave, a distance between the first electrode and the second electrode in the second sub-pixel is N2 times of a period of the second standing wave, a distance between the first electrode and the second electrode in the third sub-pixel is N3 times of a period of the third standing wave, N1<N2 and N1<N3, where N1, N2, and N3 are positive integers.

8. The display device according to claim 6, wherein the first electrode is on a light exiting side of the light-emitting layer.

9. The display device according to claim 8, wherein the first electrode is a transparent electrode layer or a transflective electrode layer, and the second electrode is a reflective electrode layer.

10. A manufacturing method of an electroluminescent display panel, comprising:

forming a plurality of pixel units on a base substrate, forming each of the plurality of pixel units comprising forming a first sub-pixel, a second sub-pixel, and a third sub-pixel, forming each of the sub-pixels comprising forming a first electrode, a light-emitting layer, and a second electrode in a direction perpendicular to the base substrate, wherein the first sub-pixel emits a first color light, the first color light forms a first standing wave including a first anti-node in the first sub-pixel, the second sub-pixel emits a second color light, the second color light forms a second standing wave including a first anti-node and a second anti-node in the second sub-pixel, the third sub-pixel emits a third color light, the third color light forms a third standing wave including a first anti-node and a second anti-node in the third sub-pixel, a wavelength of the first color light is greater than a wavelength of the second color light and a wavelength of the third color light, taking a planar surface of the first electrode facing the light-emitting layer as a reference plane, the light-emitting layer of the first sub-pixel is on the first anti-node of the first standing wave, the light-emitting layer of the second sub-pixel is on the second anti-node of the second standing wave, and the light-emitting layer of the third sub-pixel is on the second anti-node of the third standing wave, wherein the forming each of the sub-pixels comprises forming the light-emitting layer by a solution process, each of the sub-pixels further comprises a hole injecting layer and a hole transporting layer stacked in sequence between the first electrode and the light-emitting layer, the first anti-node of the second standing wave is located inside the hole injecting layer of the second sub-pixel, and the first anti-node of the third standing wave is located inside the hole injecting layer of the third sub-pixel, the first sub-pixel is a red sub-pixel, the hole injecting layer in the red sub-pixel has a thickness of 30-70 nm, and the hole transporting layer in the red sub-pixel has a thickness of 15-30 nm, the second sub-pixel is a green sub-pixel, the hole injecting layer in the green sub-pixel has a thickness of 15-110 nm, and the hole transporting layer in the green sub-pixel has a thickness of 35-135 nm, the third sub-pixel is a blue sub-pixel, the hole injecting layer in the blue sub-pixel has a thickness of 15-110 nm, and the hole transporting layer in the blue sub-pixel has a thickness of 15-115 nm, and each of the sub-pixels further comprises an electron injecting layer and an electron transporting layer stacked in sequence between the second electrode and the light-emitting layer, the electron injecting layer in each of the sub-pixels has an equal thickness, and the electron transporting layer in each of the sub-pixels has an equal thickness.

11. The manufacturing method of the electroluminescent display panel according to claim 10, wherein the forming each of the sub-pixels further comprises:

forming at least one selected from the group consisting of a hole transporting layer and a hole injecting layer between the first electrode and the light-emitting layer by a solution process.

* * * * *